(12) United States Patent
Sui et al.

(10) Patent No.: US 11,699,364 B2
(45) Date of Patent: Jul. 11, 2023

(54) STRETCHABLE DISPLAY SUBSTRATE, METHOD FOR PREPARING THE SAME, AND STRETCHABLE DISPLAY DEVICE

(71) Applicant: BOE TECHNOLOGY GROUP CO., LTD., Beijing (CN)

(72) Inventors: Kai Sui, Beijing (CN); Haibin Zhu, Beijing (CN); Che An, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 261 days.

(21) Appl. No.: 16/934,944

(22) Filed: Jul. 21, 2020

(65) Prior Publication Data
US 2021/0192983 A1 Jun. 24, 2021

(30) Foreign Application Priority Data
Dec. 20, 2019 (CN) .......................... 201911328271.9

(51) Int. Cl.
| | |
|---|---|
| *G09F 9/30* | (2006.01) |
| *H10K 50/842* | (2023.01) |
| *H10K 59/131* | (2023.01) |
| *H10K 71/00* | (2023.01) |
| *H10K 59/12* | (2023.01) |
| *H10K 102/00* | (2023.01) |

(52) U.S. Cl.
CPC ......... *G09F 9/301* (2013.01); *H10K 50/8426* (2023.02); *H10K 59/131* (2023.02); *H10K 71/00* (2023.02); *H10K 59/1201* (2023.02); *H10K 2102/311* (2023.02)

(58) Field of Classification Search
CPC . H01L 27/3276; H01L 51/5246; H01L 51/56; H01L 2227/323; H01L 2251/5338; H01L 51/5253; H01L 51/0097; H01L 27/32; H01L 51/001; H01L 51/5237; G09F 9/301
See application file for complete search history.

(56) References Cited

U.S. PATENT DOCUMENTS

| | | | | |
|---|---|---|---|---|
| 2017/0271421 A1* | 9/2017 | Jinbo | ................. | H01L 27/3258 |
| 2018/0108724 A1* | 4/2018 | Lee | ................. | H01L 27/3279 |
| 2018/0174523 A1* | 6/2018 | Jeon | ................. | H01L 51/0097 |
| 2020/0168671 A1* | 5/2020 | Jang | ................. | H01L 27/326 |
| 2021/0151715 A1* | 5/2021 | Lee | ................. | H01L 27/3258 |
| 2021/0257416 A1* | 8/2021 | Sun | ................. | H01L 51/5246 |

* cited by examiner

*Primary Examiner* — Kevin Quarterman
(74) *Attorney, Agent, or Firm* — Brooks Kushman P.C.

(57) ABSTRACT

The present disclosure provides a stretchable display substrate, a method for preparing the same, and a stretchable display device. The display substrate includes: a plurality of island areas arranged in an array, and a bridge area for connecting adjacent island areas, each of the plurality of island areas including a display region and a non-display region surrounding the display region, in which the non-display region is provided with a first groove arranged around the display region, an organic light emitting pattern arranged in the first groove, and an encapsulation pattern arranged in the first groove and covering the organic light emitting pattern in the first groove.

20 Claims, 8 Drawing Sheets

STRETCHABLE DISPLAY SUBSTRATE, METHOD FOR PREPARING THE SAME, AND STRETCHABLE DISPLAY DEVICE

CROSS-REFERENCE TO RELATED APPLICATION

This application claims priority to Chinese Patent Application No. 201911328271.9 filed on Dec. 20, 2019, which is incorporated herein by reference in its entirety.

TECHNICAL FIELD

The embodiment of the present disclosure relates to the field of display technology, in particular, to a stretchable display substrate, a method for preparing the same, and a stretchable display device.

BACKGROUND

As a "black technology", the stretchable display is introduced, and provides more options to the flexible display. At present, most of the stretchable display devices include: an island area (display unit area), a bridge area (connection unit area), and a hollow area, in which adjacent island areas are connected by a bridge area, and a certain stretch performance is achieved by stretching the hollow area. Several sub-pixels are arranged in the island area. The side length of the island area is generally in a range from 50 μm to 2000 μm. Each island needs to be packaged independently. The non-display region inside the island area is only in a range from 60 μm to 180 μm, which adds huge challenges to encapsulation reliability.

The organic light emitting (e.g., RGB) pattern of the island area can be formed by vapor deposition of a fine metal mask (FMM MASK). A fine metal mask has an island area with a sub-pixel opening and other areas without a sub-pixel opening. In this way, there is a risk that the fine metal mask sheet will be unevenly stressed and easily deformed during the production of the net, thereby resulting in color mixing during vapor deposition. Another type of fine metal mask has the entire mask provided with sub-pixel openings, that is, the entire display panel is vapor deposited with organic light emitting materials, and does not distinguish between island areas, bridge areas and hollow areas. Since the frame of the island is narrow, the display panel formed by this method has a poor encapsulation effect, and there is the phenomenon of the invasion of water and oxygen from the edge of the island area.

SUMMARY

In one aspect, an embodiment of the present disclosure provides a stretchable display substrate, including a plurality of island areas arranged in an array, and a bridge area for connecting adjacent island areas, each of the plurality of island areas including a display region and a non-display region surrounding the display region, the non-display region is provided with a first groove arranged around the display region, an organic light emitting pattern arranged in the first groove, and an encapsulation pattern arranged in the first groove and covering the organic light emitting pattern in the first groove.

Exemplarily, there is a plurality of the first grooves, the plurality of first grooves is distributed at intervals around the display region, and a size of an opening of each of the first grooves is greater than or equal to a size of the organic light emitting pattern in the first groove.

Exemplarily, each side of the island area comprises n first grooves in a direction from the non-display region to the display region, a value of n being in a range from 1 to 10.

Exemplarily, the first groove is a rectangular groove having a length $a_2$, a width $a_1$ and a height $a_3$, in which a value of $a_1$ is in a range from 1.0 μm to 50.0 μm, a value of $a_2$ is in a range from 1.0 μm to 50.0 μm, and a value of $a_3$ is in a range from 1.0 μm to 5.0 μm.

Exemplarily, the non-display is further provided with an annular groove arranged around the display region and located between the first groove and the display region, an organic light emitting pattern arranged in the annular groove, and an encapsulation pattern arranged in the annular groove and covering the organic light emitting pattern in the annular groove.

Exemplarily, the stretchable display substrate includes: a planarization layer, the annular groove is arranged on the planarization layer, and a height of the planarization layer from the annular groove to the display region gradually increases.

Exemplarily, the bridge area is provided with: a second groove arranged along an extending direction of the bridge area, an organic light emitting pattern arranged in the second groove, and an encapsulation pattern arranged in the second groove and covering the organic light emitting pattern in the second groove.

Exemplarily, there is a plurality of the second grooves, the plurality of second grooves is distributed at intervals along the extending direction of the bridge area, and a size of an opening of each of the plurality of second grooves is greater than or equal to a size of the organic light emitting pattern in the second groove.

Exemplarily, the second groove is a strip-shaped groove, the strip-shaped groove is formed by at least two convex structures arranged in the bridge area, each of the at least two convex structures extends along an extending direction of the bridge area, and a width of an opening of the strip-shaped groove is greater than or equal to a width of the organic light emitting pattern in the second groove.

Exemplarily, each of the at least two convex structures is a cylindrical convex structure, and a value of the height $c_1$ of the cylindrical convex structure is in a range from 1.0 μm to 15.0 μm, a value of the width $c_2$ is in a range from 1.0 μm to 40.0 μm, and a value of the width $c_3$ of the strip-shaped groove is in a range from 1.0 μm to 50.0 μm.

Exemplarily, the non-display region is further provided with an annular dam structure arranged around the first groove.

Exemplarily, the encapsulation pattern is made of encapsulation adhesive mixed with a desiccant.

In another aspect, an embodiment of the present disclosure provides a stretchable display device including the stretchable display substrate described above.

In still another aspect, an embodiment of the present disclosure provides a method for preparing a stretchable display substrate, including: providing a flexible substrate, including a plurality of island areas arranged in an array and a bridge area for connecting adjacent island areas, each of the plurality of island areas including a display region and a non-display region surrounding the display region; forming a first groove arranged around the display region; providing a fine metal mask provided with sub-pixel openings in both the display region and the non-display region; forming an organic light emitting pattern by using the fine metal mask, the organic light emitting pattern corresponding to the first groove being formed in the first groove; and forming an encapsulation pattern in the first groove, to cover the organic light emitting pattern in the first groove by the encapsulation pattern.

Exemplarily, after the forming the organic light emitting pattern by using the fine metal mask, the method further includes: rinsing the flexible substrate on which the organic light emitting pattern is formed with an organic solvent; and baking the rinsed flexible substrate to volatilize the organic solvent.

Exemplarily, during the rinsing, the organic light emitting pattern located proximate to the first groove is rinsed into the first groove.

Further, the method further includes: forming an annular groove arranged around the display region and located between the first groove and the display region; in which the organic light emitting pattern of the annular groove is formed in the annular groove.

Further, the method further includes: forming a second groove arranged along an extending direction of the bridge area in the bridge area, in which the organic light emitting pattern of the second groove is formed in the second groove; and forming an encapsulation pattern in the second groove, to cover the organic light emitting pattern in the second groove.

Further, the method further includes: forming at least two convex structures arranged along an extending direction of the bridge area in the bridge area, and forming a strip-shaped groove between adjacent convex structures, a width of an opening of the strip-shaped groove being greater than or equal to a width of the organic light emitting pattern in the second groove.

Further, the method further includes: forming an annular dam structure arranged around the first groove in the non-display region.

BRIEF DESCRIPTION OF THE DRAWINGS

By reading the detailed description of optional embodiments below, various other advantages and benefits will become apparent to a person skilled in the art. The drawings are only for the purpose of showing optional embodiments, and are not considered as limitations to the present disclosure. Furthermore, throughout the drawings, the same reference numbers are used to denote the same components. In the drawings.

DETAILED DESCRIPTION

The technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on these embodiments, a person skilled in the art may, without any creative effort, obtain the other embodiments, which also fall within the scope of the present disclosure.

Figure 1:
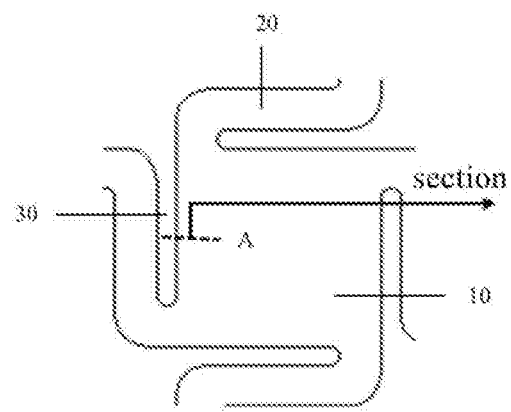
FIG. 1 is a top view showing a stretchable display substrate in the related art.

Please refer to FIG. 1. FIG. 1 is a top view showing a stretchable display substrate in the related art. The stretchable display substrate includes: an island area (display unit area) 10, a bridge area (connection unit area) 20, and a hollow area 30, in which adjacent island areas 10 are connected by a bridge area 20. A light emitting unit is provided in the island area, and the light emitting unit includes an organic light emitting pattern.

The organic light emitting pattern can be formed by vapor deposition of organic light emitting materials using a fine metal mask (FMM MASK).

The fine metal mask may include two types.

The first type of fine metal mask has an area corresponding to the island area provided with the sub-pixel opening and other area (the area corresponding to the bridge area and the hollow area) not provided with the sub-pixel opening. This type of fine metal mask when being spread will cause uneven strain stress, resulting in warpage and unevenness in the sub-pixel opening of the island area corresponding to the fine metal mask, and large shadows and color mixing during vapor deposition.

The second type of fine metal mask has the entire mask provided with sub-pixel openings, and does not distinguish between island areas, bridge areas and hollow areas. This type of fine metal mask is evenly stress when the net is stretched, thereby ensuring the yield of vapor deposition. However, organic light emitting materials are vapor deposited on the island area frame, bridge area, and hollow area, and the organic light emitting material easily absorbs water and oxygen to cause risks, like film explosion.

Figure 2:
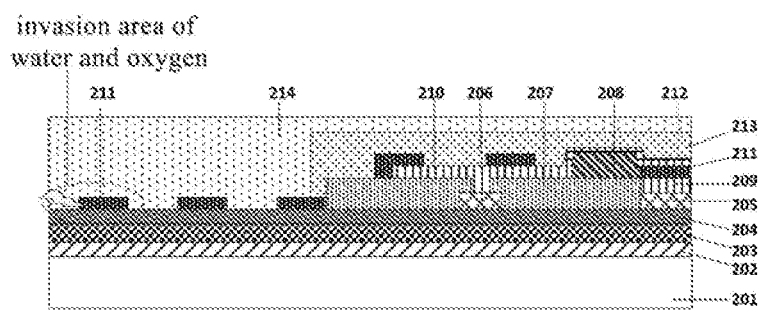
FIG. 2 is a schematic view showing the longitudinal section at position A of the stretchable display substrate in FIG. 1.

Please refer to FIG. 2. FIG. 2 is a schematic view showing the longitudinal section at position A of the stretchable display substrate in FIG. 1, in which the organic light emitting pattern of the stretchable display substrate is formed by vapor deposition of the second fine metal mask described above. The stretchable display substrate includes: a flexible substrate (PI) 201, a first gate insulating layer (GI1) 202, a second gate insulating layer (GI2) 203, an interlayer dielectric layer (ILD) 204, a source/drain metal electrode (SD) 205, a power line (VSS) 206, a planarization layer (PLN) 207, a pixel definition layer (PDL) 208, an anode 209, a connection pattern 210, an organic light emitting pattern (EL RGB) 211, an organic common layer (EL Common) 212, a cathode 213, and a thin film encapsulation layer (TFE) 214.

When the second type of fine metal mask is vapor deposited to form the organic light emitting pattern of the stretchable display substrate, an organic light emitting material is vapor deposited on the island area frame (non-display region), the bridge area and the hollow area. After experimental testing, it was found that the frame of the island area of the stretchable display substrate is poor due to the encapsulation effect, the organic light emitting material will absorb water and oxygen, which invades the display region of the island area along the boundary of the island area, thereby resulting in a film burst phenomenon, leading to package failure.

Figure 3:
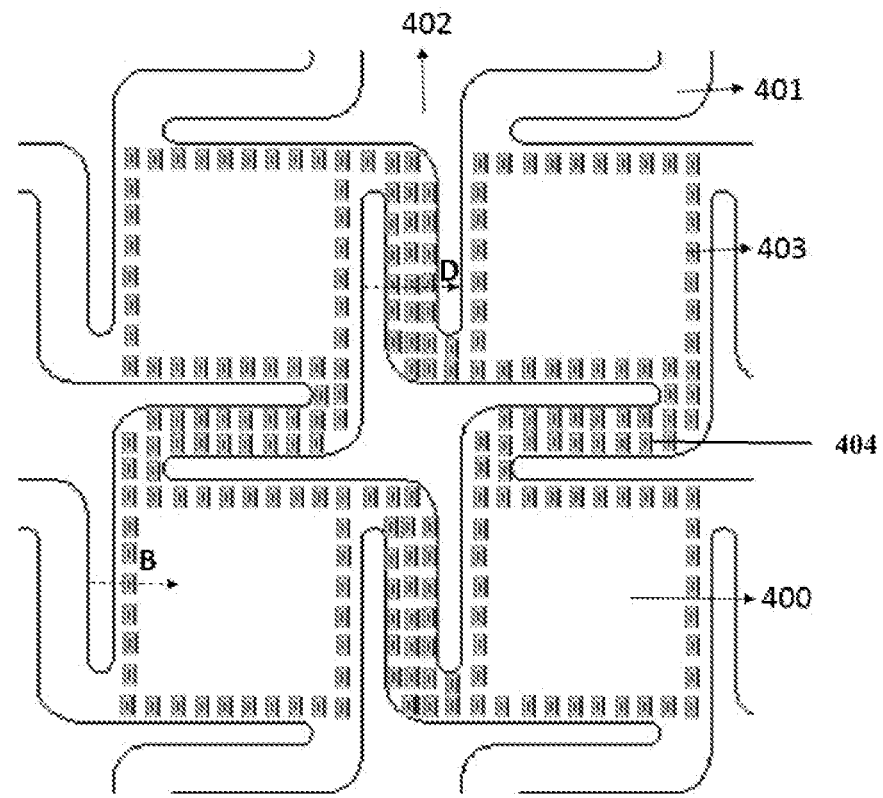
FIG. 3 is a top view showing the stretchable display substrate according to an embodiment of the present disclosure.

To solve the above problem, please refer to FIG. 3. FIG. 3 is a top view showing the stretchable display substrate according to an embodiment of the present disclosure. An embodiment of the present disclosure provides a stretchable display substrate, including: a plurality of island areas 400 arranged in an array; a bridge area 401 for connecting the adjacent island areas 400, in which the island area 400 includes a display region (AA region) and a non-display region (non-AA region) surrounding the display region, and a hollow area 402. The non-display region is provided with: a first groove 403 arranged around the display region, an organic light emitting pattern (not shown) arranged in the first groove 403, and an encapsulation pattern (not shown) arranged in the first groove 403 and covering the organic light emitting pattern in the first groove 403.

Exemplarily, the island area 400 is used to set the light emitting unit, and the bridge area 401 is used to set the signal wiring.

In the embodiment of the present disclosure, in the non-display region of the island area, a groove surrounding the display region is arranged, an organic light emitting material can be vapor deposited by a fine metal mask with a sub-pixel opening arranged in the entire mask; in the non-display region of the island area, the organic light emitting material will be vapor deposited into the groove, and then the organic light emitting material of the groove is encapsulated by the encapsulation pattern to improve the encapsulation effect and avoid the film burst phenomenon caused by the absorption of water and oxygen using the organic light emitting material at the edge of the non-display region. At the same time, the organic light emitting material is vapor deposited by using a fine metal mask having sub-pixel openings arranged in the entire mask, thereby reducing the difficulty of preparing the fine metal mask and the color mixing phenomenon during vapor deposition, ensuring the yield of vapor deposition, and further improving the yield of the stretchable display substrate.

The first groove 403 may be provided in various types, which will be described below as an example.

In some embodiments of the present disclosure, optionally, as shown in FIG. 3, there is a plurality of the first grooves 403, and the plurality of first grooves 403 are distributed at intervals around the display region 400, in which the size of the opening of the first groove 403 is greater than or equal to the size of the organic light emitting pattern in the first groove 403, and the arrangement and size of the first groove 403 match the arrangement and size of the sub-pixel openings (corresponding to the organic light emitting pattern) at corresponding positions on the fine metal mask, so as to prevent the organic light emitting patterns from being vapor deposited outside the first groove 403.

Figure 5:
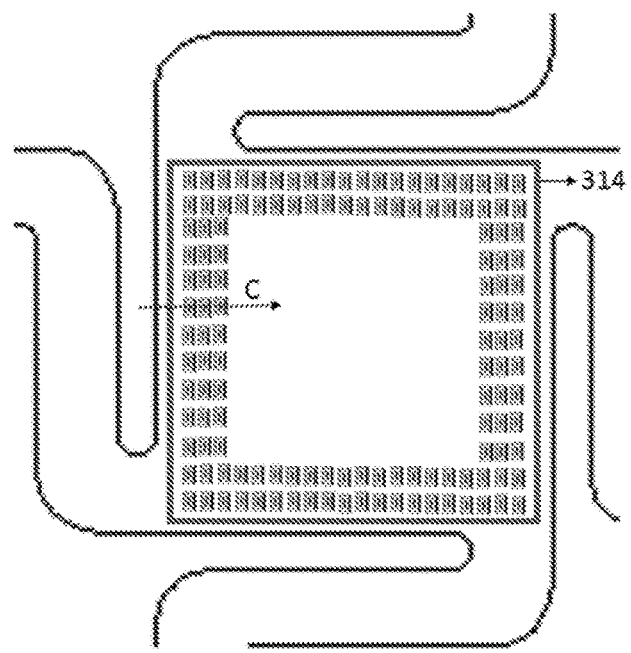
FIG. 5 is a top view showing the stretchable display substrate according to another embodiment of the present disclosure.

In an embodiment of the present disclosure, optionally, each side of the island area includes n first grooves in a direction from the non-display region to the display region, a value of n being in a range from 1 to 10. The specific value of n is determined according to the size of the sub-pixel opening on the fine metal mask and the width of the non-display region. In the embodiment shown in FIG. 3, for each frame of the island area 400, in a direction from the non-display region to the display region, it includes one (1) first groove 403. The non-display region is provided with a plurality of first grooves 403 distributed at intervals around the display region. Of course, the arrangement of the first groove 403 is not limited to the above manner. In some other embodiments of the present disclosure, please refer to FIG. 5. On two frames of the island area, in a direction from the non-display region to the display region, it includes three (3) first grooves 403; and on other two frames, in a direction from the non-display region to the display region, it includes two (2) first grooves.

Figure 4:
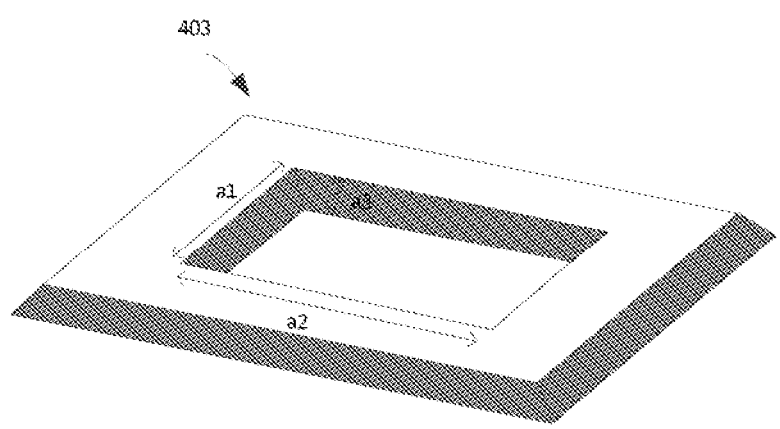
FIG. 4 is an enlarged schematic view showing the first groove at position B of the stretchable display substrate in FIG. 3.

Please refer to FIG. 4. FIG. 4 is an enlarged schematic view showing the first groove 403 at position B of the stretchable display substrate in FIG. 3. As can be seen from FIG. 4, the first groove 403 is a rectangular groove having a length of a2, a width of a1, and a height of a3. Optionally, the value of a1 is in a range from 1.0 μm to 50.0 μm, and optionally 18.0 μm; the value of a2 is in a range from 1.0 μm to 50.0 μm, and optionally 24.0 μm; and the value of a3 is in a range from 1.0 μm to 5.0 μm, and optionally 2.0 μm.

In some other embodiments of the present disclosure, the first groove may also be other types of grooves, for example, at least one annular groove surrounding the display region.

In an embodiment of the present disclosure, optionally, the non-display region is further provided with an annular groove arranged around the display region and located between the first groove and the display region, an organic light emitting pattern arranged in the annular groove, and an encapsulation pattern arranged in the annular groove and covering the organic light emitting pattern in the annular groove. The annular groove is arranged proximate to the display region, and is used to encapsulate the organic light emitting pattern formed at a position proximate to the display region to further improve the encapsulation effect.

The organic light emitting pattern in the annular groove can be obtained by using an organic solvent to rinse the organic light emitting pattern formed proximate to the position of the display region, so that the organic light emitting material enters the annular groove. Optionally, the stretchable display substrate includes: a planarization layer, the annular groove is arranged on the planarization layer, a height of the planarization layer from the annular groove to the display region gradually increases, so that the organic light emitting material is rinsed by the organic solvent flows into the annular groove.

In the embodiment of the present disclosure, optionally, an annular dam structure (DAM) arranged around the first groove is further arranged in the non-display region, and the annular dam structure may block the cracks of the inorganic layer of the island area to avoid water and oxygen intrusion. The longitudinal cross section of the annular dam structure may have an inverted trapezoid shape.

In the embodiment of the present disclosure, optionally, the encapsulation pattern is made of encapsulation adhesive mixed with a desiccant, and the encapsulation pattern may be printed into the groove by a printing process and fixedly formed. Exemplarily, the desiccant may be CaO (calcium oxide), BaO (barium oxide), MgO (magnesium oxide), TiO (titanium oxide) and other materials that are reactive with water and oxygen, and the encapsulation adhesive may be formed of a material having low water permeability such as transparent UV-curable and thermosetting resin adhesives.

The following describes the film structure of the island area as an example.

Figure 6:
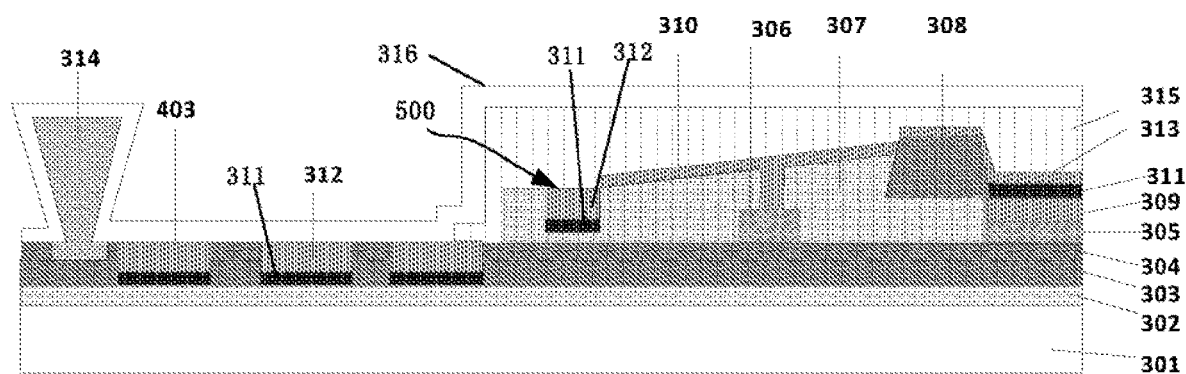
FIG. 6 is a schematic view showing the longitudinal section at position C of the stretchable display substrate in FIG. 5.

Please refer to FIG. 6. FIG. 6 is a schematic view showing the longitudinal section at position C of the stretchable display substrate in FIG. 5, and the stretchable device includes: a flexible substrate (PI) 301, including a plurality of island areas arranged in an array and a bridge area for connecting adjacent island areas, the island area including a display region and a non-display region surrounding the display region; a first gate insulating layer (GI1) 302; a second gate insulating layer (GI2) 303; an interlayer dielectric layer (ILD) 304; a plurality of first grooves 403 arranged in the non-display region and distributed at intervals around the display region, in which the first grooves 403 are formed on the second gate insulating layer 302 and the interlayer dielectric layer 304, and penetrate the second gate insulating layer 302 and the interlayer dielectric layer 304. In some other embodiments of the present disclosure, the first groove 403 may also be formed only on the interlayer dielectric layer 304, or on the first gate insulating layer 302, the second gate insulating layer 303, and the interlayer dielectric layer 304; a source/drain metal electrode (SD) 305; a power line (VSS) 306, in which the power line 306 and the source/drain metal electrode 305 may be made of the same material, and are formed through a single patterning process; a planarization layer (PLN) 307; an annular groove 500 arranged around the display region and located between the first groove 403 and the display region, in which the annular groove 500 is arranged on the planarization layer 307; a pixel definition layer (PDL) 308; an anode 309; a connection pattern 310; the connection pattern 310 and the anode 309 can be made of the same material (e.g., indium tin oxide (ITO)) and formed by a single patterning process, and the connection pattern 310 is connected to the power line 306 through the via hole in the planarization layer 307; an organic light emitting pattern (EL RGB) 311, in which the organic light emitting pattern 311 includes an organic light emitting pattern located in the first groove 403, an organic light emitting pattern located in the display region, and an organic light emitting pattern located in the annular groove 500; and the organic light emitting pattern located in the display region is used to form a light emitting unit; an encapsulation pattern 312 located in the first groove 403 and the annular groove 500 and covering the organic light emitting pattern 311 in the first groove 403 and the annular groove 500; an organic common layer (EL Common) 313; an annular dam structure 314 arranged at the edge of the non-display region and surrounding the first groove 403, in which the longitudinal cross section of the annular dam structure 314 may have an inverted trapezoid shape; a cathode 315; and a thin film encapsulation layer (TFE) 316.

In the above embodiment, the encapsulation effect of the island area is improved by providing a groove in the island area and forming an encapsulation pattern covering the organic light emitting pattern in the groove. In addition, a groove may also be arranged in the bridge area, and an encapsulation pattern covering the organic light emitting pattern may be formed in the groove to improve the encapsulation effect of the bridge area. This will be explained in detail below.

Figure 7:
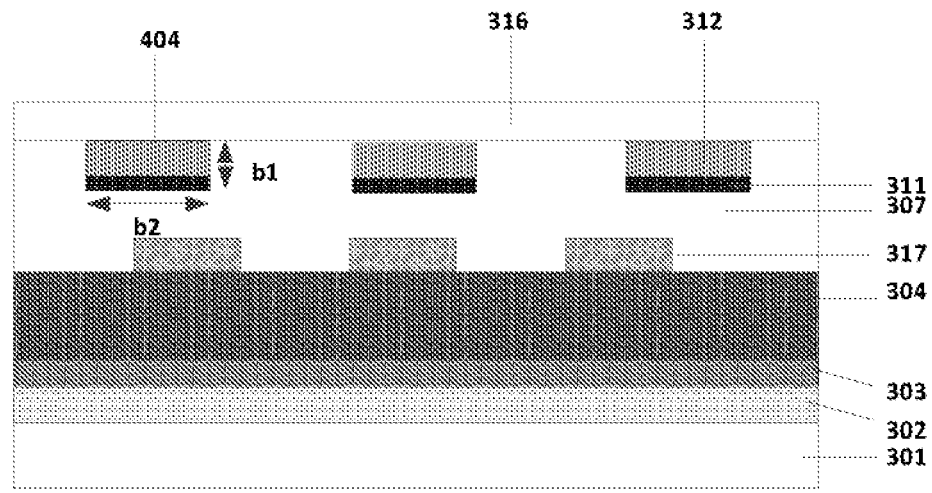
FIG. 7 is a schematic view showing the longitudinal section at position D of the stretchable display substrate in FIG. 3.
Figure 8:
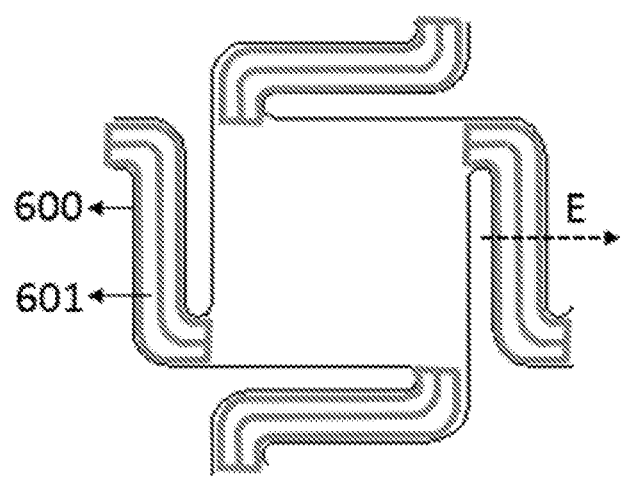
FIG. 8 is a top view showing the stretchable display substrate according to another embodiment of the present disclosure.

In some embodiments of the present disclosure, please refer to FIG. 3 and FIG. 7, the bridge area 401 is provided with: a second groove 404 arranged along an extending direction of the bridge area 401, an organic light emitting pattern 311 arranged in the second groove 404, and an encapsulation pattern 312 arranged in the second groove 404 and covering the organic light emitting pattern in the second groove 404.

In the embodiment of the present disclosure, when a groove is provided in the bridge area and an organic light emitting pattern can be vapor deposited by a fine metal mask with a sub-pixel opening arranged in the entire mask, the organic light emitting pattern of the bridge area is vapor deposited to the second groove, and the organic light emitting pattern in the second groove is encapsulated by using an encapsulation pattern, thereby improving the encapsulation effect of the bridge area. In addition, the organic light emitting pattern is vapor deposited by using a fine metal mask having sub-pixel openings arranged in the entire mask, thereby ensuring the yield of vapor deposition and avoiding the problem of the color mixing in the vapor deposition.

In some embodiments of the present disclosure, optionally, please refer to FIG. 3 and FIG. 7, there is a plurality of the second grooves 404, the plurality of second grooves is distributed at intervals along an extending direction of the bridge area, and a size of an opening of each of the plurality of second grooves is greater than or equal to a size of the organic light emitting pattern 311 in the second groove. Providing a plurality of second grooves 404 distributed at intervals in the bridge area can not only effectively encapsulate the organic light emitting pattern of the bridge area, but also improve the stretchable performance of the bridge area.

In the embodiment of the present disclosure, optionally, the shape and size of the second groove are the same as the shape and size of the first groove. Please refer to FIG. 7. In the second groove 404, the value of the height b1 may be in a range from 1.0 μm to 50.0 μm, and optionally 18.0 μm; and the value of the width b2 is in a range from 1.0 μm to 5.0 μm, and optionally 2.0 μm.

The following describes the film structure of the bridge area as an example.

Please refer to FIG. 7. FIG. 7 is a schematic view showing the longitudinal section at position D of the stretchable display substrate in FIG. 3; and the stretchable device includes: a flexible substrate (P) 301, the flexible substrate 301 including a plurality of island areas arranged in an array, and a bridge area for connecting adjacent island areas; a first gate insulating layer (GI1) 302; a second gate insulating layer (GI2) 303; an interlayer dielectric layer (ILD) 304; a source/drain metal wiring (SD) 317; a planarization layer (PLN) 307; a plurality of second grooves 404 distributed at intervals along an extending direction of the bridge area and arranged in the planarization layer 307; an organic light emitting pattern (EL RGB) 311; an encapsulation pattern 312 located in the second groove 404 and covering the organic light emitting pattern 311 in the second groove 404; and a thin film encapsulation layer (TFE) 316.

The second groove may also be other types of structures, which will be described below as an example.

In some other embodiments of the present disclosure, please refer to FIGS. 8 to 11, the second groove is a strip-shaped groove 601, the strip-shaped groove 601 is formed by at least two convex structures 600 arranged in the bridge area, the convex structure 600 extends along an extending direction of the bridge area, and a width of an opening of the strip-shaped groove 601 is greater than or equal to a width of an organic light emitting pattern.

Figure 9:
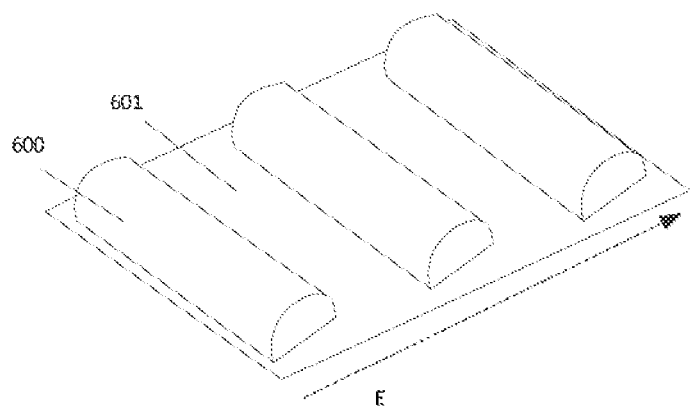
FIG. 9 is a schematic view showing the strip-shaped groove of the bridge area according to an embodiment of the present disclosure.
Figure 10:
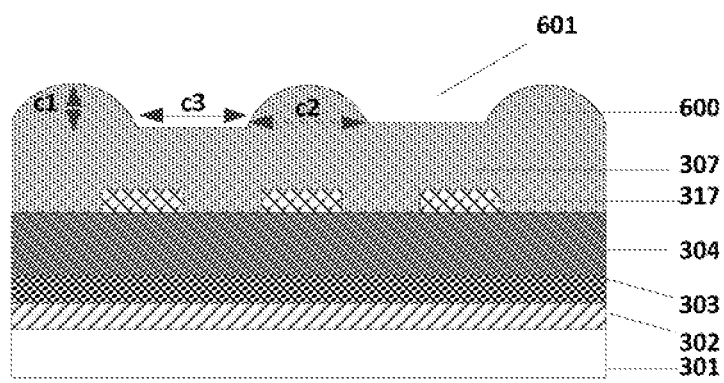
FIG. 10 is a schematic view showing the longitudinal section at position E of the stretchable display substrate in FIGS. 8 and 9.

Please refer to FIGS. 9 and 10. The strip-shaped convex structure 600 may be a cylindrical convex structure. In the cylindrical convex structure, the value of the height c1 is in a range from 1.0 µm to 15.0 µm, and optionally 5.0 µm; and the value of the width c2 is in a range from 1.0 µm to 40.0 µm, and optionally 16 µm. The value of the width c3 of the strip-shaped groove 601 is in a range from 1.0 µm to 50.0 µm, and optionally 25 µm.

Of course, the strip-shaped convex structure may also have other shapes, e.g., a convex with a rectangular cross section, a trapezoid shape, and the like.

The following describes the film structure of the bridge area as an example.

Figure 11:
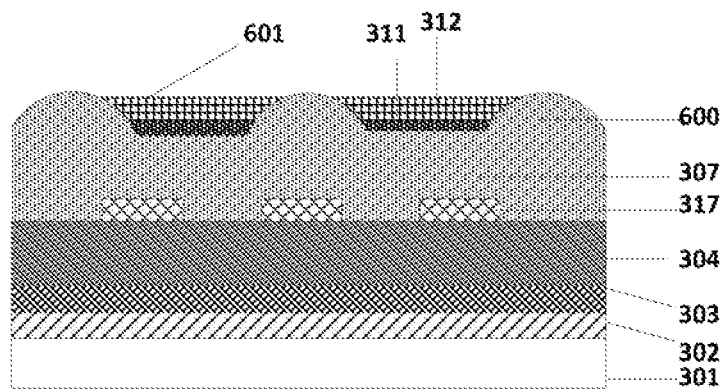
FIG. 11 is a schematic view showing a structure of the stretchable display substrate in FIG. 10 after an organic light emitting pattern and an encapsulation pattern are formed.

Please refer to FIGS. 10 and 11. FIG. 10 is a schematic view showing the longitudinal section at position E of the stretchable display substrate in FIGS. 8 and 9. The stretchable device includes: a flexible substrate (PI) 301, the flexible substrate 301 including a plurality of island areas arranged in an array, and a bridge area for connecting adjacent island areas; a first gate insulating layer (GI1) 302; a second gate insulating layer (GI2) 303; an interlayer dielectric layer (ILD) 304; a source/drain metal wiring (SD) 317; a planarization layer (PLN) 307; a plurality of convex structures 600, in which the strip-shaped grooves 601 are formed between adjacent convex structures 600, and the strip-shaped grooves 601 extend along the extending direction of the bridge area; an organic light emitting pattern (EL RGB) 311; and an encapsulation pattern 312 located in the strip-shaped groove 601 and covering the organic light emitting pattern 311 in the strip-shaped groove 601.

In each of the above embodiments, optionally, the encapsulation pattern is made of encapsulation adhesive mixed with a desiccant, and the encapsulation pattern may be printed into the groove by a printing process and fixedly formed. Exemplarily, the desiccant may be CaO (calcium oxide), BaO (barium oxide), MgO (magnesium oxide), TiO (titanium oxide) and other materials that are reactive with water and oxygen, and the encapsulation adhesive may be formed of a material having low water permeability such as transparent UV-curable and thermosetting resin adhesives.

In each of the above embodiments, optionally, the stretchable display substrate further includes: a thin film encapsulation layer (TFE), which is used to encapsulate the island area and the bridge area and to further improve the encapsulation performance.

The embodiments of the present disclosure further provide a stretchable display device, including the stretchable display substrate described above. The stretchable display substrate may be an OLED display substrate.

The embodiments of the present disclosure further provide a method for preparing a stretchable display substrate, which is used to form the stretchable display substrate described above. The method includes the following steps.

Step S1: providing a flexible substrate, including a plurality of island areas arranged in an array and a bridge area for connecting adjacent island areas, each of the plurality of island area including a display region and a non-display region surrounding the display region.

Step S2: forming a first groove arranged around the display region.

Specifically, a first film layer may be formed on the flexible substrate first, and the first film layer may include a first gate insulating layer, a second gate insulating layer, and an interlayer dielectric layer, or include a second gate insulating layer and an interlayer dielectric layer, or include an interlayer dielectric layer; and then the first film layer is subjected to a patterning process to form the first groove.

Step S3: providing a fine metal mask provided with sub-pixel openings in position corresponding to both the display region and the non-display region.

That is, the fine metal mask is a mask provided with sub-pixel openings on the entire mask.

Step S4: forming an organic light emitting pattern by using the fine metal mask, the organic light emitting pattern corresponding to the first groove being formed in the first groove.

Step S5: forming an encapsulation pattern in the first groove to cover the organic light emitting pattern in the first groove.

Optionally, the forming the organic light emitting pattern by using the fine metal mask further includes the following steps.

Step S41: rinsing the flexible substrate on which the organic light emitting pattern is formed with an organic solvent.

In the embodiment of the present disclosure, the organic solvent may be ethanol, dichloromethane, acetonitrile, acetone, isopropanol, alkane, tetrahydrofuran, lipid or ether organic solvents.

Step S42: baking the rinsed flexible substrate to volatilize the organic solvent.

In the embodiment of the present disclosure, the baking temperature may be in a range from 60° C. to 100° C., and optionally 80° C.

During the rinsing, the organic light emitting pattern located proximate to the first groove may be rinsed into the first groove.

In the embodiment of the present disclosure, after the forming the encapsulation pattern in the first groove, the method further includes: forming a thin film encapsulation layer.

In the embodiment of the present disclosure, a groove is formed in the non-display region at the edge of the island area, the vapor deposited organic light emitting material is correspondingly vapor deposited into the groove, and the organic light emitting material that is not vapor deposited into the groove can be dissolved into the groove by an organic solvent. After the organic solvent is volatilized, an encapsulation pattern is formed in the groove for encapsulation protection, and then a thin film encapsulation layer is made to further improve the encapsulation performance. Besides, the preparing process is simple and easy.

Optionally, there is a plurality of the first grooves, the plurality of first grooves is distributed at intervals around the display region, and a size of an opening of each of the plurality of first grooves is greater than or equal to a size of the organic light emitting pattern in the first groove.

Optionally, each side of the island area includes n first grooves in a direction from the non-display region to the display region, a value of n being in a range from 1 to 10.

Optionally, the method further includes: forming an annular groove arranged around the display region and located between the first groove and the display region; in which the organic light emitting pattern corresponding to the annular groove is formed in the annular groove; and forming an encapsulation pattern in the annular groove to cover the organic light emitting pattern in the annular groove.

Exemplarily, when the flexible substrate on which the organic light emitting pattern is formed is rinsed with an organic solvent, the organic light emitting pattern located proximate to the annular groove is rinsed into the annular groove.

Optionally, the height of the planarization layer from the annular groove to the display region gradually increases, which facilitates rinsing the organic light emitting pattern proximate to the annular groove into the annular groove.

Optionally, the method further includes: forming a second groove arranged along an extending direction of the bridge area in the bridge area; in which the organic light emitting pattern corresponding to the second groove is formed in the second groove; and forming an encapsulation pattern in the second groove to cover the organic light emitting pattern in the second groove.

Optionally, there is a plurality of the second grooves, the plurality of second grooves is distributed at intervals along an extending direction of the bridge area, and a size of an opening of each of the plurality of second grooves is greater than or equal to a size of the organic light emitting pattern in the second groove.

Optionally, the method further includes: forming at least two convex structures arranged along an extending direction of the bridge area in the bridge area, and forming a strip-shaped groove between adjacent convex structures, a width of an opening of the strip-shaped groove being greater than or equal to a width of the organic light emitting pattern in the second groove, in which exemplarily, the organic light emitting pattern corresponding to the strip-shaped groove is formed in the strip-shaped groove; and forming an encapsulation pattern in the strip-shaped groove to cover the organic light emitting pattern in the strip-shaped groove.

Optionally, the method further includes: forming an annular dam structure arranged around the first groove in the non-display region.

Optionally, the above encapsulation pattern is made of encapsulation adhesive mixed with a desiccant.

In the above embodiments of the present disclosure, optionally, the method further includes: forming an organic light emitting layer by vapor deposition. The mask used for the vapor deposition of the organic common layer may be a mask hollowed out at the island area and not hollowed out in other areas.

The method for preparing the stretchable display substrate according to the embodiment of the present disclosure will be described by taking the island area frame structure as an example.

Figure 12A:
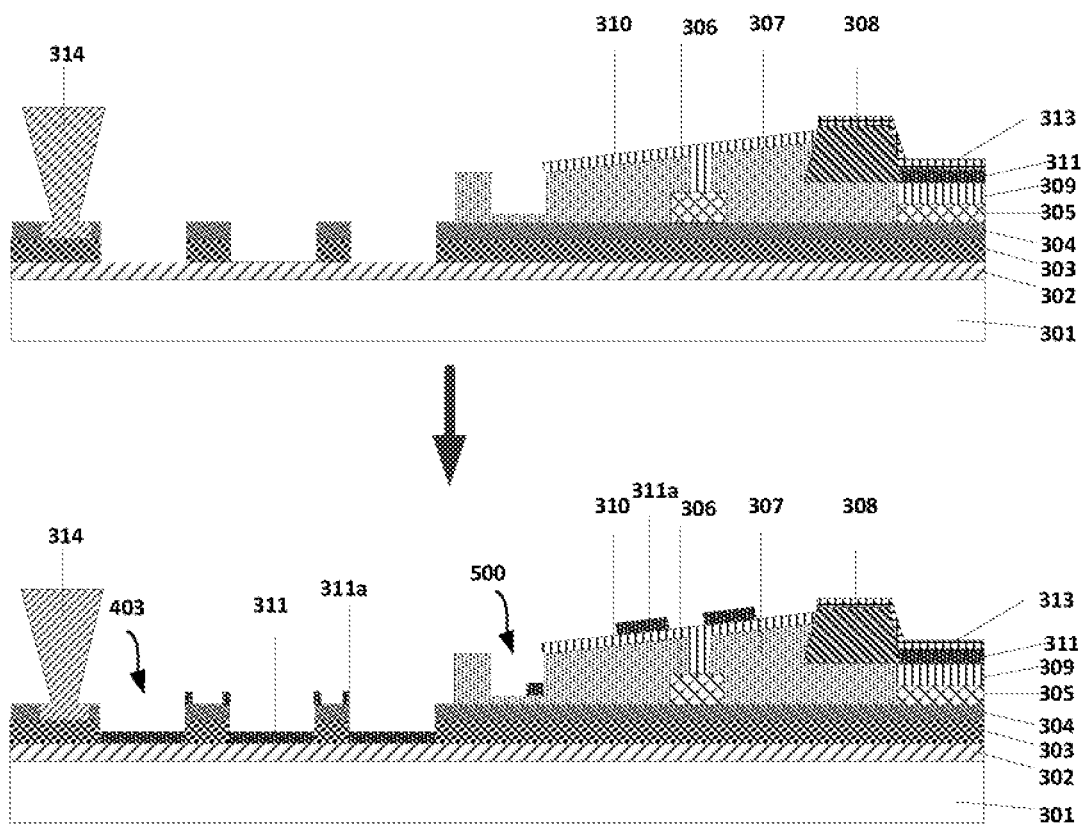
FIGS. 12A to 12C are schematic views showing the method for preparing the stretchable display substrate according to an embodiment of the present disclosure.
Figure 12B:
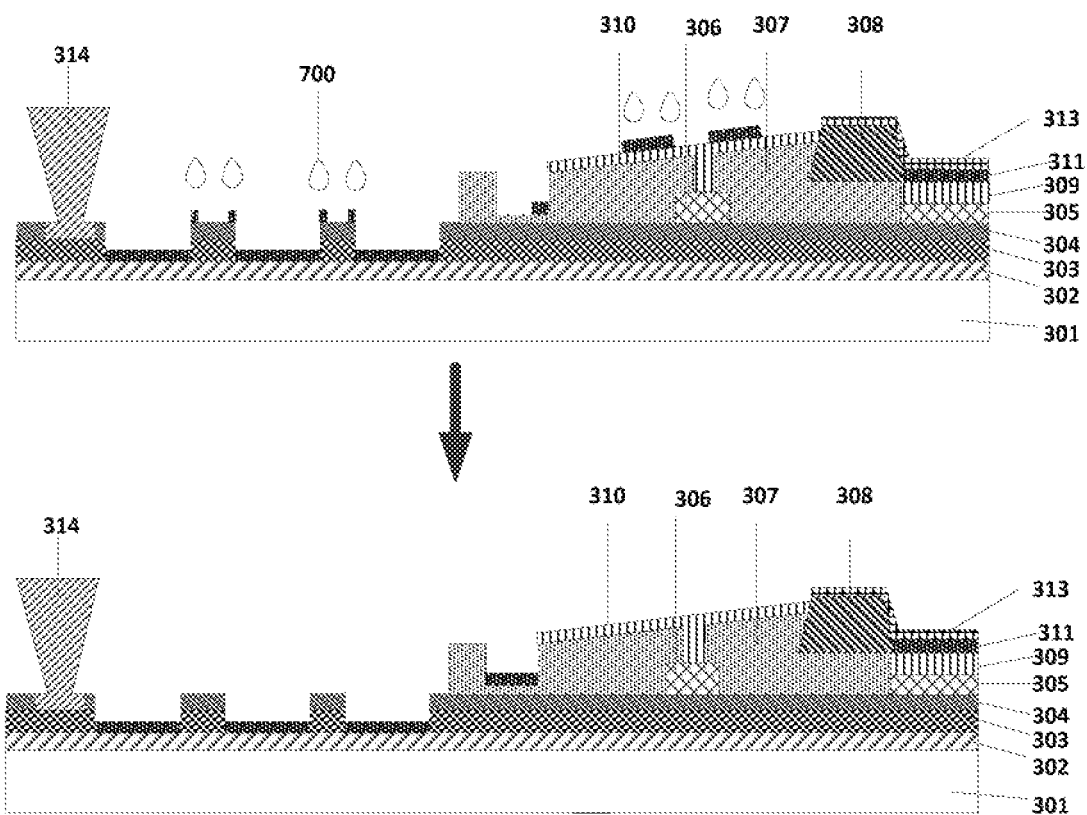
Figure 12:
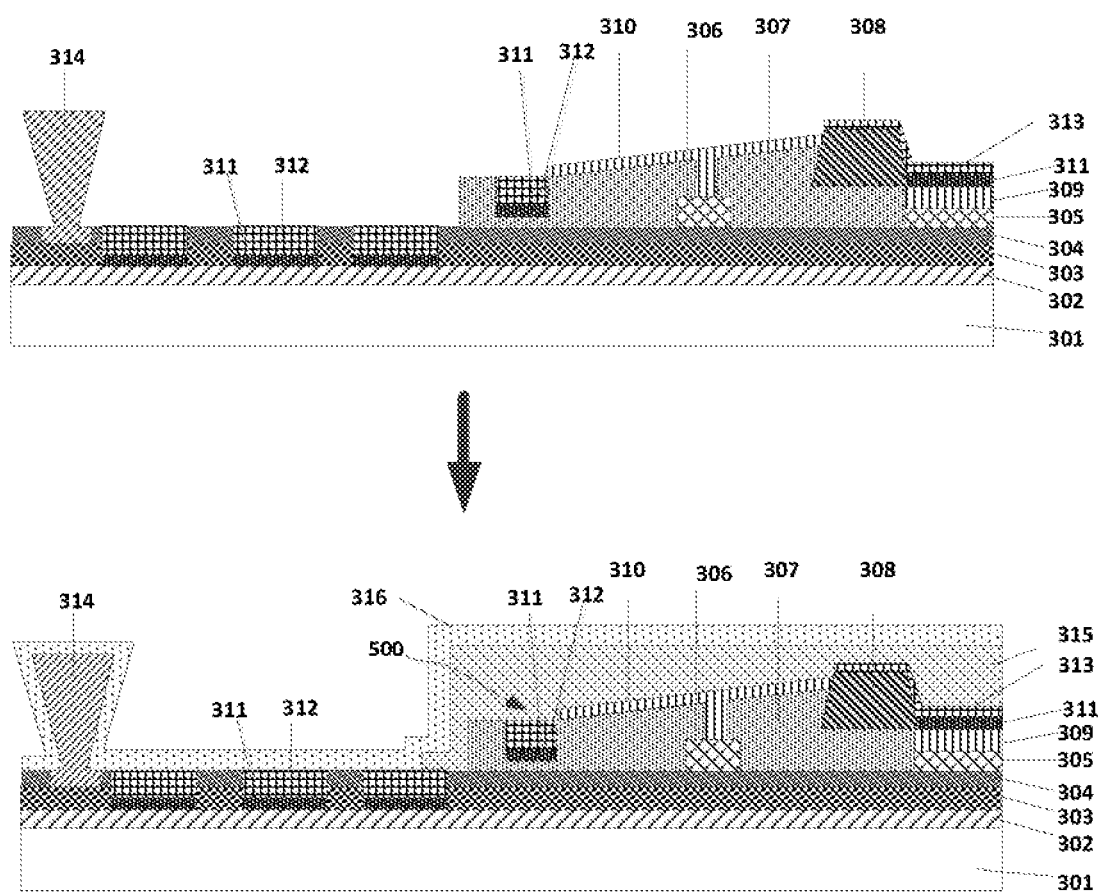

Please refer to FIGS. 12A to 12C, the method for preparing the stretchable display substrate includes the following steps.

Step 21: referring to FIG. 12A, the organic light emitting pattern 311 and the organic common layer 313 are vapor deposited on the substrate, and the organic light emitting material will be vapor deposited into the first groove 403 and the annular groove 500, but due to alignment or shadow, some organic light emitting materials 311a may deviate from the first groove 403 and the annular groove 500.

Step 22: referring to FIG. 12B, the organic light emitting material is rinsed into the first groove 403 and the annular groove 500 with the organic solvent 700.

The organic solvent may be ethanol, dichloromethane, acetonitrile, acetone, isopropanol, alkane, tetrahydrofuran, lipid or ether organic solvents.

Step 23: the substrate is placed at 80° C. and baked for 40 minutes to evaporate the organic solvent.

Step 24: referring to FIG. 12C, the encapsulation adhesive 312 mixed with a desiccant is printed into the first groove 403 and the annular groove 500, in which the desiccant may be a material that is reactive with water and oxygen, such as CaO, BaO, MgO and TiO. The encapsulation adhesive 312 is formed by a material having a low water permeability such as transparent UV-curable and thermosetting resin adhesives.

Step 25: a thin film encapsulation layer 316 is prepared to further improve encapsulation performance.

As for other film layers of the substrate, referring to the description of the embodiment corresponding to FIG. 6, the specific forming process will not be described in detail.

In the present disclosure, a groove is arranged in the non-display region at the edge of the island area, the vapor deposited organic light emitting material is correspondingly vapor deposited into the groove, and the organic light emitting material that is not vapor deposited into the groove can be dissolved into the groove with an organic solvent. After the organic solvent is volatilized, an encapsulation adhesive is printed into the groove for encapsulation protection, and a thin film encapsulation layer is made to further improve the encapsulation performance. The present disclosure can improve the encapsulation reliability of the stretchable display substrate, avoid large shadows and color mixing phenomenon caused by the difficulty in the preparation of the fine metal mask, and improve the yield of the stretchable display device.

The embodiments of the present disclosure have been described above with reference to the accompanying drawings, but the present disclosure is not limited to the above specific embodiments, and the above specific embodiments are merely illustrative, and not restrictive. Without departing from the scope of the present disclosure and the scope of protection of the claims, a person skilled in the art can made many variations in light of the present disclosure, all of which fall into the protection of the present disclosure.

What is claimed is:

1. A stretchable display substrate, comprising a plurality of island areas arranged in an array, and a bridge area for connecting adjacent island areas, each of the plurality of island areas comprising a display region and a non-display region surrounding the display region, wherein the non-display region is provided with a first groove arranged around the display region, an organic light emitting pattern arranged in the first groove, and an encapsulation pattern arranged in the first groove and covering the organic light emitting pattern in the first groove.

2. The stretchable display substrate of claim 1, wherein there is a plurality of first grooves, the plurality of first grooves is distributed at intervals around the display region, and a size of an opening of each of the first grooves is greater than or equal to a size of the organic light emitting pattern in the first groove.

3. The stretchable display substrate of claim 2, wherein each side of each island area comprises n first grooves in a cross-section of the island along a direction from the non-display region to the display region, a value of n being in a range from 1 to 10.

4. The stretchable display substrate of claim 1, wherein the first groove is a rectangular groove having a length a2, a width a1 and a height a3, wherein a value of a1 is in a range from 1.0 µm to 50.0 µm, a value of a2 is in a range from 1.0 µm to 50.0 µm, and a value of a3 is in a range from 1.0 µm to 5.0 µm.

5. The stretchable display substrate of claim 1, wherein the non-display region is further provided with an annular groove arranged around the display region and located between the first groove and the display region, an organic light emitting pattern arranged in the annular groove, and an encapsulation pattern arranged in the annular groove and covering the organic light emitting pattern in the annular groove.

6. The stretchable display substrate of claim 5, wherein the stretchable display substrate further comprises: a planarization layer, the annular groove is arranged on the planarization layer, and a height of the planarization layer from the annular groove to the display region gradually increases.

7. The stretchable display substrate of claim 1, wherein the bridge area is provided with: a second groove arranged along an extending direction of the bridge area, an organic light emitting pattern arranged in the second groove, and an encapsulation pattern arranged in the second groove and covering the organic light emitting pattern in the second groove.

8. The stretchable display substrate of claim 7, wherein there is a plurality of second grooves, the plurality of second grooves is distributed at intervals along the extending direction of the bridge area, and a size of an opening of each of the plurality of second grooves is greater than or equal to a size of the organic light emitting pattern in the second groove.

9. The stretchable display substrate of claim 7, wherein the second groove is a strip-shaped groove, the strip-shaped groove is formed by at least two convex structures arranged in the bridge area, each of the at least two convex structures extends along an extending direction of the bridge area, and a width of an opening of the strip-shaped groove is greater than or equal to a width of the organic light emitting pattern in the second groove.

10. The stretchable display substrate of claim 9, wherein each of the at least two convex structures is a cylindrical convex structure, and a value of a height c1 of the cylindrical convex structure is in a range from 1.0 μm to 15.0 μm, a value of a width c2 is in a range from 1.0 μm to 40.0 μm, and a value of a width c3 of the strip-shaped groove is in a range from 1.0 μm to 50.0 μm.

11. The stretchable display substrate of claim 1, wherein the non-display region is further provided with an annular dam structure arranged around the first groove.

12. The stretchable display substrate of claim 1, wherein the encapsulation pattern is made of encapsulation adhesive mixed with a desiccant.

13. A stretchable display device comprising the stretchable display substrate of claim 1.

14. A method for preparing a stretchable display substrate, comprising:
providing a flexible substrate, comprising a plurality of island areas arranged in an array and a bridge area for connecting adjacent island areas, each of the plurality of island areas comprising a display region and a non-display region surrounding the display region;
forming a first groove arranged around the display region;
providing a fine metal mask provided with sub-pixel openings in both the display region and the non-display region;
forming an organic light emitting pattern by using the fine metal mask, the organic light emitting pattern of the first groove being formed in the first groove; and
forming an encapsulation pattern in the first groove to cover the organic light emitting pattern in the first groove.

15. The method of claim 14, wherein after the forming the organic light emitting pattern by using the fine metal mask, the method further comprises:
rinsing the flexible substrate on which the organic light emitting pattern is formed with an organic solvent; and
baking the rinsed flexible substrate to volatilize the organic solvent.

16. The method of claim 15, wherein during the rinsing, the organic light emitting pattern located proximate to the first groove is rinsed into the first groove.

17. The method of claim 14, further comprising:
forming an annular groove arranged around the display region and located between the first groove and the display region; wherein the organic light emitting pattern of the annular groove is formed in the annular groove.

18. The method of claim 14, further comprising:
forming a second groove arranged along an extending direction of the bridge area in the bridge area, wherein the organic light emitting pattern of the second groove is formed in the second groove; and
forming an encapsulation pattern in the second groove to cover the organic light emitting pattern in the second groove.

19. The method of claim 14, further comprising:
forming at least two convex structures arranged along an extending direction of the bridge area in the bridge area, and forming a strip-shaped groove between adjacent convex structures, a width of an opening of the strip-shaped groove being greater than or equal to a width of the organic light emitting pattern in the second groove.

20. The method of claim 14, further comprising: forming an annular dam structure arranged around the first groove in the non-display region.

* * * * *